(12) United States Patent
Kim et al.

(10) Patent No.: US 11,786,942 B2
(45) Date of Patent: Oct. 17, 2023

(54) MASK GLUE REMOVING APPARATUS, SYSTEM AND METHOD

(71) Applicant: SK hynix Inc., Gyeonggi-do (KR)

(72) Inventors: Sung Hyun Kim, Gyeonggi-do (KR); Seok Joo Kim, Gyeonggi-do (KR); Kyung Hyun Nam, Gyeonggi-do (KR); Jin Sick Shin, Gyeonggi-do (KR); Hoon Chae, Gyeonggi-do (KR); Jung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/086,675

(22) Filed: Nov. 2, 2020

(65) Prior Publication Data

US 2021/0362199 A1    Nov. 25, 2021

(30) Foreign Application Priority Data

May 21, 2020    (KR) .......... 10-2020-0060959

(51) Int. Cl.
*B08B 3/02* (2006.01)
*B08B 5/02* (2006.01)
*G03F 1/82* (2012.01)
*B05B 1/14* (2006.01)

(52) U.S. Cl.
CPC ............ *B08B 3/02* (2013.01); *B05B 1/14* (2013.01); *B08B 5/02* (2013.01); *G03F 1/82* (2013.01); *B08B 2203/02* (2013.01); *B08B 2220/01* (2013.01)

(58) Field of Classification Search
CPC . H01L 21/67051; G03F 1/82; B08B 2203/02; B08B 2220/01
See application file for complete search history.

(56) References Cited

U.S. PATENT DOCUMENTS

| | | | |
|---|---|---|---|
| 2011/0023914 A1* | 2/2011 | Jeong | G03F 1/82 134/30 |
| 2011/0247661 A1* | 10/2011 | Hayashida | G03F 7/42 134/198 |
| 2012/0234363 A1* | 9/2012 | Cho | G03F 1/82 134/99.1 |
| 2015/0270146 A1* | 9/2015 | Yoshihara | H01L 21/67103 134/18 |

FOREIGN PATENT DOCUMENTS

| | | |
|---|---|---|
| JP | 2016-031412 | 3/2016 |
| JP | 2006-091667 | 4/2016 |
| KR | 10-2008-0001469 | 1/2008 |

* cited by examiner

*Primary Examiner* — Natasha N Campbell
(74) *Attorney, Agent, or Firm* — IP & T GROUP LLP

(57) ABSTRACT

A mask glue removing apparatus includes a first plate including a plurality of nozzles to be adjusted at independent dispensing angles of each other and a head in which the plurality of nozzles are installed and configured to move the head close to a position corresponding to a region of a mask in which glue is present, adjust the dispensing angles of the plurality of nozzles to face the region in which the glue is present, and dispense a chemical liquid, rinse, or air through the plurality of nozzles to remove the glue, and a second plate on which the mask is placed and configured to adjust a position of a main body according to a removal process for the glue.

16 Claims, 9 Drawing Sheets

MASK GLUE REMOVING APPARATUS, SYSTEM AND METHOD

CROSS-REFERENCES TO RELATED APPLICATION

The present application claims priority under 35 U.S.C. § 119(a) to Korean Patent Application Number 10-2020-0060959, filed on May 21, 2020, which is incorporated herein by reference in its entirety.

BACKGROUND

1. Technical Field

Various embodiments generally relate to a semiconductor device and, more particularly, to a mask glue removing apparatus, system and method.

2. Related Art

A transparent thin film pellicle may be attached to a surface of an exposure mask using glue in order to protect the surface of the exposure mask from molecules in the air or other types of contamination sources. However, as time elapses or when certain semiconductor manufacturing processes are performed, the glue is cured which makes removal of the glue more difficult.

In recent years, to remove the cured glue, a liquid chemical cleaning process is performed on a region of the mask in which mask patterns are formed as well as on a region of the mask in which the glue is present. Since the mask patterns are not a removing target, the cleaning process attempts to remove the glue without affecting the mask patterns as much as possible. However, the glue may not be completely removed, and thus the mask has to be often discarded.

On the other hand, when a liquid-reinforced chemical cleaning process is performed to remove the glue more effectively, a portion of the mask patterns may also be removed and, thus, the pattern size may be changed. As a result, often a new mask needs to be produced, thus increasing the mask production cost.

SUMMARY

Various embodiments are provided for an improved mask glue removing apparatus, system, and method, capable of enhanced glue removal from a mask.

According to an embodiment of the present disclosure, a mask glue removing apparatus may include: a first plate including a plurality of nozzles configured to be adjusted at independent dispensing angles of each other and a head in which the plurality of nozzles are installed and configured to move the head close to a position corresponding to a region of a mask in which glue is present, adjust the dispensing angles so that the plurality of nozzles face the region in which the glue is present, and dispense a chemical liquid, rinse, and air through the plurality of nozzles to remove the glue; and a second plate on which the mask is placed and configured to adjust a position of a main body thereof according to a removal process for the glue.

According to another embodiment of the present disclosure, a mask glue removing system may include: a first plate including a plurality of nozzles to be adjusted at independent dispensing angles of each other and a head in which the plurality of nozzles are installed and configured to move the head close to a position corresponding to a region of a mask in which glue is present, adjust the dispensing angles so that the plurality of nozzles face the region in which the glue is present, and dispense a chemical liquid, rinse, or air through the plurality of nozzles to remove the glue; a second plate on which the mask is placed on and configured to adjust a position of a main body according to a removal process for the glue; a driver configured to change a position and a state of the first plate, or a position and a state of the second plate; and a controller configured to control operations of the first and second plates through the driver according to the removal process of the glue.

According to yet another embodiment of the present disclosure, a mask glue removing method may include: moving a position of a head of a first plate so that the head is located close to a position corresponding to a region of a mask in which glue is present; adjusting dispensing angles of a plurality of nozzles mounted on the first plate so that the plurality of nozzles face the region in which the glue is present; adjusting a position of a second plate according to a removal process for the glue when the mask is placed on the second plate; and performing a removing operation for the glue by dispensing a chemical liquid, rinse, or air through the plurality of nozzles.

According to yet another embodiment of the present disclosure, a mask glue removing apparatus may include: a first plate including a head with a plurality of adjustable nozzles, the first plate being configured to move the head closer to a glue region of a mask, and a second plate on which the mask is placed, the second plate being configured to adjust a position of a main body thereof according to a removal process for the glue.

The first plate is configured to adjust the nozzles independently from each other at one or more dispensing angles so that the plurality of nozzles face the glue region of the mask.

The nozzles are configured to dispense at least one of a chemical liquid, rinse, and air.

The glue may be removed without affecting patterns formed on the mask.

A chemical liquid for removing the glue may be dispensed with air. Thus, the chemical liquid and the glue separated from the mask may be prevented from flowing into a pattern surface of the mask in advance.

Further, in an embodiment, a barrier wall may be formed for preventing the chemical liquid and the glue separated from the mask from flowing into the pattern surface of the mask, thus, preventing mask pattern damage during mask glue removal process.

These and other features, aspects, and embodiments are described in more detail below.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure are described in detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the present disclosure. Although a few embodiments of the present disclosure are shown and described, it will be appreciated by those of ordinary skill in the art that changes may be made in these embodiments without departing from the principles and spirit of the present disclosure.

A mask disclosed herein may be, for example, a photomask used in a semiconductor fabrication process and may be referred to as a mask for clarity.

Glue disclosed herein may refer to, for example, a glue for attaching a pellicle to the mask, but this is not limited thereto.

Figure 1:
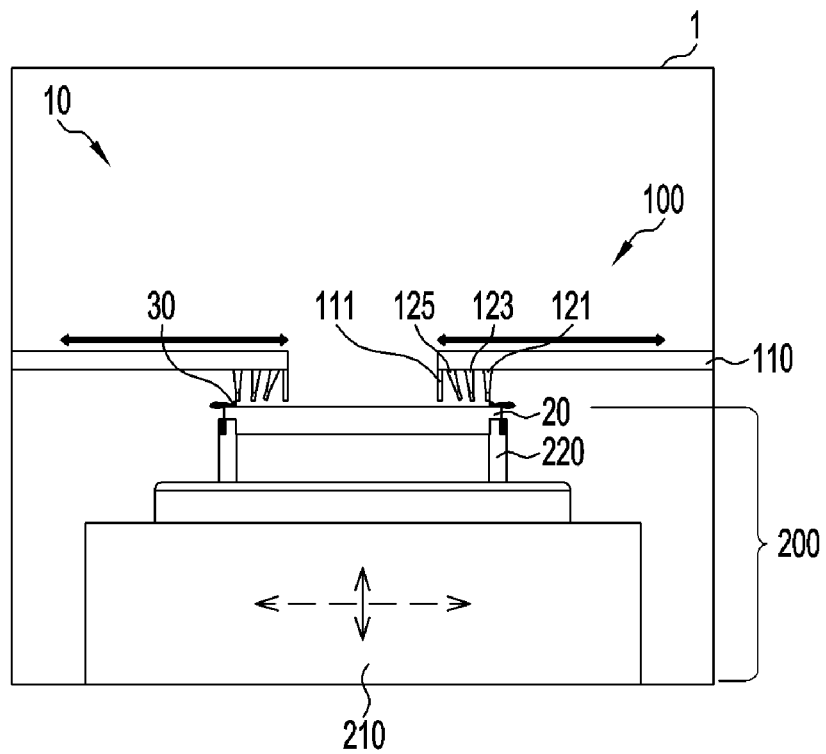
FIG. 1 is a diagram illustrating an outer appearance of a mask glue removing apparatus according to embodiments of the present disclosure.
Figure 2:
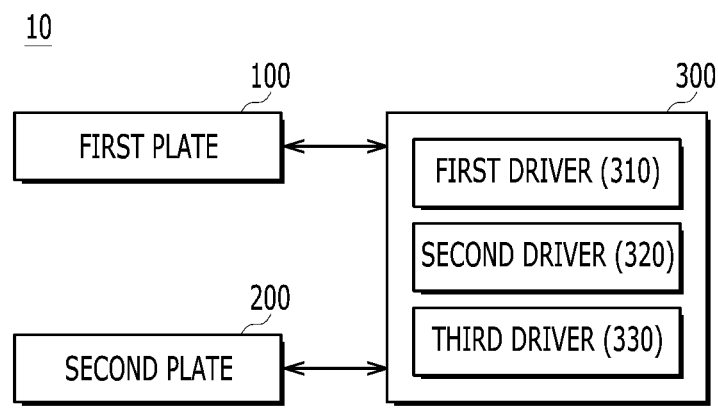
FIG. 2 is a block diagram illustrating a configuration of a mask glue removing apparatus according to an embodiment of the present disclosure.

FIG. 1 is a diagram illustrating an outer appearance of a mask glue removing apparatus according to an embodiment of the present disclosure. FIG. 2 is a block diagram illustrating a configuration of a mask glue removing apparatus according to an embodiment of the present disclosure.

Referring to FIG. 1, a mask glue removing apparatus 10 may be provided in the inside of a chamber 1 and may be configured to remove glue 30 formed in the mask 20.

As illustrated in FIG. 2, the mask glue removing apparatus 10 may include a first plate 100, a second plate 200, and a driver 300.

As illustrated in FIG. 1, the first plate 100 may include a head 110, a plurality of nozzles 121, 123, and 125 installed in a head 110. A barrier wall 111 may also be installed on the head 110.

The first plate 100 may include the plurality of nozzles 121, 123, and 125 which may be adjusted at independent dispensing angles of each other and the head 110 in which the plurality of nozzles 121, 123, and 125 are installed. The head 110 may be movable to adjust its position. The head 110 may move close to a position corresponding to a region of the mask 20 in which the glue 30 is present. The dispensing angles of the plurality of nozzles 121, 123, and 125 may be adjusted to face the region in which the glue is present, and may dispense a chemical liquid, rinse, or air through the plurality of nozzles 121, 123, and 125 to remove the glue 30 from the mask 20.

Figure 8:
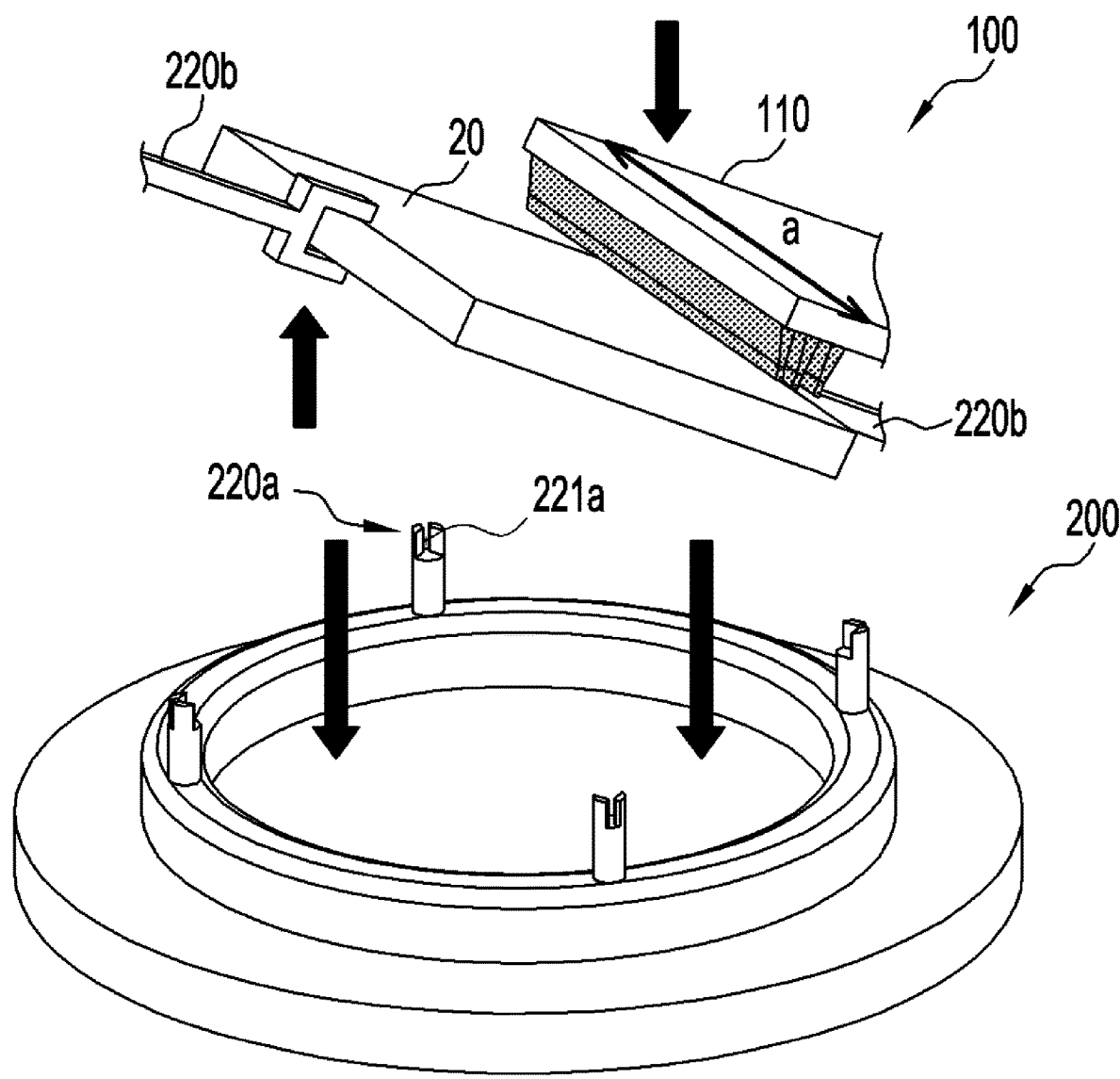
FIG. 8 is a diagram for describing an example of adjusting a position of a mask according to an embodiment of the present disclosure.
Figure 9:
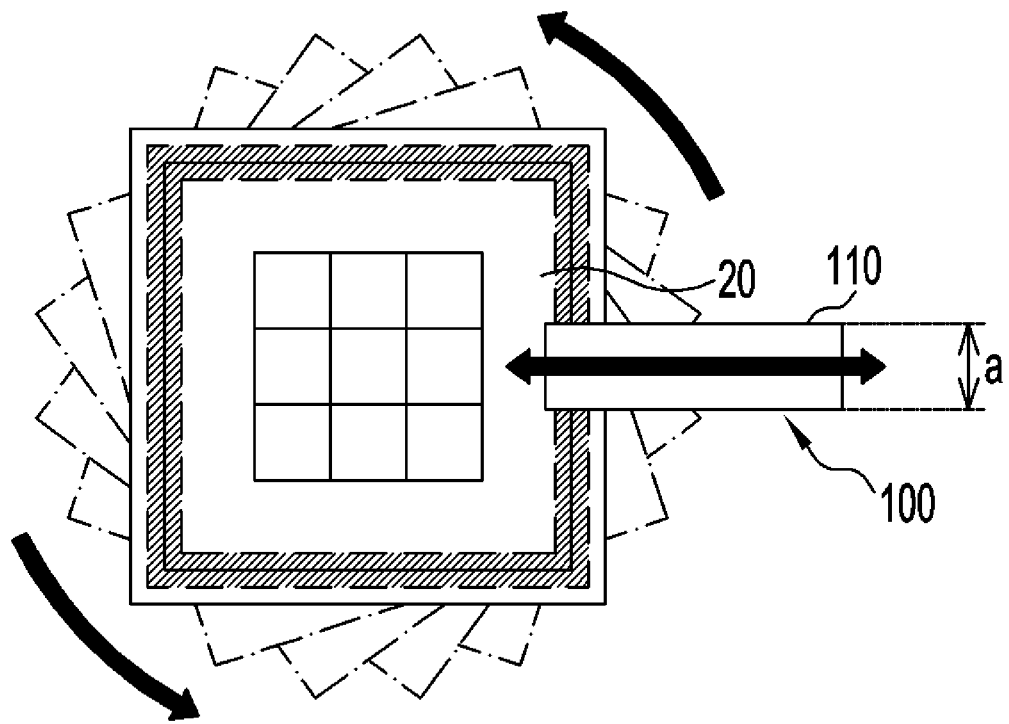
FIGS. 9 and 10 are diagrams for describing another example of adjusting a position of a second plate according to an embodiment of the present disclosure.

The first plate 100 may be formed so that a width of the head 110 in a first direction (see "a" of FIGS. 8 and 9) corresponds to an entire length of one side of a top surface of the mask 20 (see FIG. 8) or corresponds to a length of a portion of the one side of the top surface of the mask 20 (see FIG. 9).

The first plate 100 having the structure illustrated in FIG. 8 may allow the chemical liquid and the like to reach the whole one side of the mask 20 even without movement of the head 110 while dispensing the chemical liquid and the like.

The first plate 100 may have the structure illustrated in FIG. 9 and may be applied when removing the glue 30 through a rotation method of the second plate 200 while dispensing the chemical liquid and the like. A detailed description of this embodiment will be made later.

The structure of the first plate 100 is not limited to the structures of FIGS. 8 and 9, and may be modified according to the need of the operator.

Figure 3:
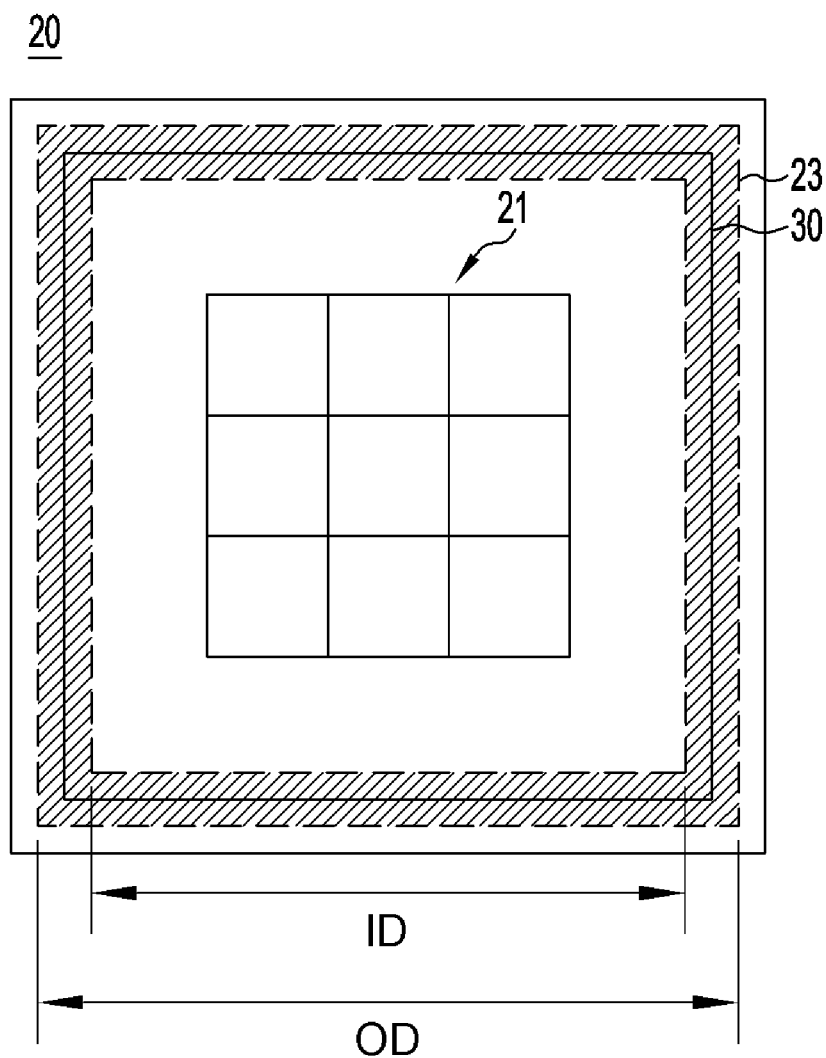
FIG. 3 is a diagram illustrating a mask before glue is removed from the mask according to an embodiment of the present disclosure.

FIG. 3 is a diagram illustrating a state of the mask 20 before the glue 30 is removed from the mask 20 according to an embodiment of the present disclosure.

Referring to FIG. 3, the mask 20 may include a pattern region 21 in which various types of patterns used for exposure are formed and a glue region 23 in which the glue 30 for attaching the pellicle to the mask 20 is formed.

Specifically, the position of the head 110 may be adjusted in a horizontal direction with respect to the top surface of the mask 20 so that the plurality of nozzles 121, 123, 125 which are installed in the head 110 may move close to the glue region 23 to easily remove the glue 30.

The position of the head 110 may be manually or automatically adjusted based on a dimension type of the pellicle attached to the mask 20 or the region in which the glue is located in the mask 20, for example, the glue region 23, which is captured through an image capturer (not shown). The method of adjusting the position of the head 110 is not limited to the method of adjusting the position of the head 110 in the horizontal direction with respect to the top surface of the mask 20. The position of the head 110 may also be adjusted in a vertical direction with respect to the top surface of the mask 20 according to the need of the operator.

The pellicle dimension type may refer to a dimension of the pellicle attached to the mask 20 and include various dimensions. The position in which the glue is formed may be estimated according to the pellicle dimensions, and thus the pellicle dimensions may be considered when the position of the head 110 is adjusted. Specifically, the pellicle dimensions may include an inner dimension and an outer dimension and the glue may be estimated to be located in a region of the mask 20 between the inner dimension (ID of FIG. 3) and the outer dimension (OD of FIG. 3) of the pellicle.

The plurality of nozzles 121, 123, and 125 may be adjusted at dispensing angles independent of each other.

Specifically, the plurality of nozzles 121, 123, and 125 may include a first nozzle 121 configured to dispense a chemical liquid for removing the glue, a second nozzle 123 configured to dispense rinse, and a third nozzle 125 configured to dispense air.

As the chemical liquid, a sulfuric acid peroxide mixture (SPM) in which $H_2SO_4$ and $H_2O_2$ are mixed or $H_2SO_4$ may be employed. However, the chemical liquid is not limited thereto and another material which can remove the glue 30 may be employed as the chemical liquid.

As the rinse, deionized (DI) water such as a mixture of $H_2O$ and $CO_2$ may be employed, but this is not limited thereto.

The air may be $N_2$ gas, but this is not limited thereto.

The plurality of nozzles 121, 123, and 125 may dispense the liquid chemical, the rinse, and the air in a non-contact manner in a state that the plurality of nozzles 121, 123, and 125 are spaced from the mask 20.

The first nozzle 121, the second nozzle 123, and the third nozzle 125 may be arranged in order of the first nozzle 121, the second nozzle 123, and the third nozzle 125 on the basis of the region in which the glue 30 is present. Since the chemical liquid, the rinse, and the air are simultaneously or individually dispensed from the first nozzle 121, the second nozzle 123, and the third nozzle 125, the dispensing angles of the first to third nozzles 121, 123, and 125 may be adjusted to prevent the chemical liquid, the rinse, and the air dispensed through the nozzles from interfering with each other.

The dispensing angles of the plurality of nozzles 121, 123, and 125 may be adjusted according to the pellicle dimension type of the mask 20 or the pattern size of the mask 20, or may be adjusted according to a position of the glue 30 in the mask 20 determined through an image capturer (not shown).

The pellicle dimension type may refer to a dimension of the pellicle attached to the mask 20 and include various dimensions. The position in which the glue is to be formed may be estimated according to the pellicle dimension, and thus the pellicle dimension type may be considered when the dispensing angles of the plurality of nozzles 121, 123, and 125 are adjusted.

Figure 4:
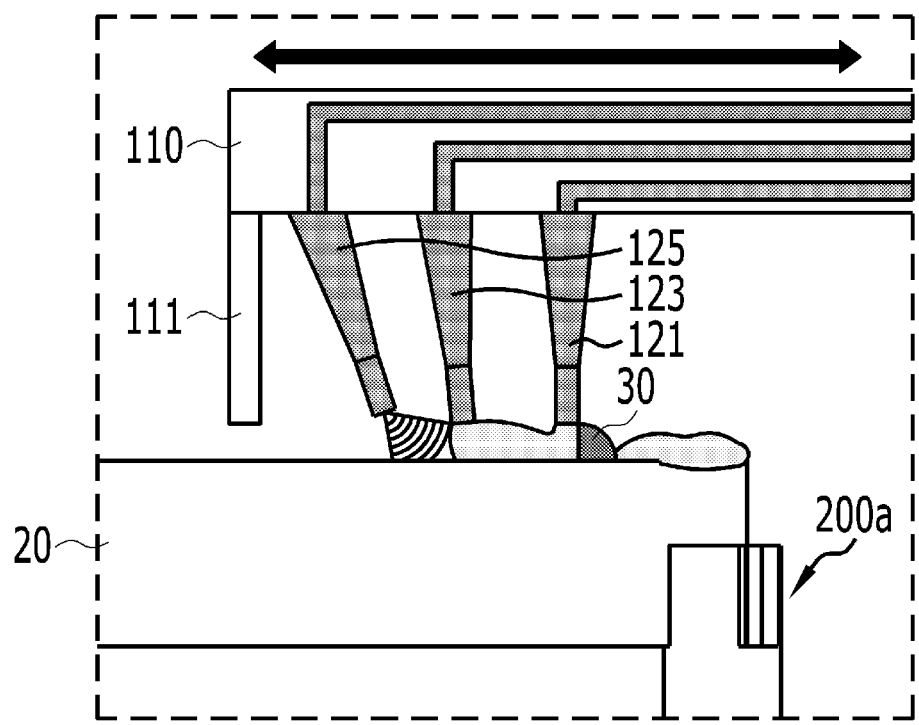
FIG. 4 is a detailed diagram illustrating a portion of the mask glue removing apparatus of FIG. 1.

FIG. 4 is a detailed diagram illustrating a portion of the mask glue removing apparatus of FIG. 1.

As illustrated in FIG. 4, the dispensing angles of the first nozzle 121, the second nozzle 123, and the third nozzle 125 may be adjusted so that the first to third nozzles 121, 123, and 125 may face the glue 30. For example, slopes of the first nozzle 121 and the second nozzle 123, which are close to the glue 30, may be adjusted substantially at a right angle with respect to the glue 30 and a slope of the third nozzle 125, which is far from the glue 30, may be adjusted at an acute angle with respect to the glue 30. However, this is not limited thereto and the first to third nozzles 121, 123, and 125 may be adjusted at any slope which can easily remove the glue 30.

The barrier wall 111 may be configured to block the chemical liquid, the rinse, and the air dispensed from the first nozzle 121, the second nozzle 123, and the third nozzle 125 from flowing into the pattern region 21 of the mask 20.

As illustrated in FIG. 3, when the mask 20 is divided into the pattern region 21 and the glue region 23, the barrier wall 111 may prevent the chemical liquid, the rinse, and the air from flowing into the pattern region 21.

Referring to FIG. 4, the barrier wall 111 may be formed to be located next the third nozzle 125 on the basis of the glue 30 in a state that the plurality of nozzles are arranged in order of the first nozzle 121, the second nozzle 123, and the third nozzle 125.

The barrier wall 111 may be downwardly formed from a bottom surface of the head 110. A downward length of the barrier wall 111 may be determined in consideration of a condition that the chemical liquid, the rinse, and the air dispensed from the first nozzle 121, the second nozzle 123, and the third nozzle 125 are prevented from flowing into the pattern region 21 of the mask 20 and a condition that a reference distance spaced from the mask 20 placed on the second plate 200 is maintained. For example, more particularly, the barrier wall 111 may be sized to be generally adequately longer than the nozzles 121, 123, and 125 so that when the nozzles are positioned at the desired position close to the mask for ejecting the fluids, the lowermost end of the barrier wall 111 may contact the mask to form a barrier to prevent the flow of the fluids from the glue region 23 of the mask 20 to the pattern region 21 of the mask 20.

As shown in FIG. 1, a plurality of first plates 100 may be provided and the plurality of first plates 100 may be installed in a position corresponding to at least one among a first side, a second side, a third side, and a fourth side of the top surface of the mask 20 in which the glue 30 is formed.

Referring to FIG. 1, each of the plurality of first plates 100 may be installed in an inner wall of the chamber 1 and move in upper and lower directions (a vertical direction) and left and right directions (a horizontal direction) with respect to the top surface of the mask 20. In an embodiment, a length of only one of the plurality of first plates 100 may extend so that the one first plate may move to be close to the mask 20 and remaining first plates 100 may be maintained in a state close to the inner wall of the chamber 1. Although not shown in FIG. 1, the first plate 100 may be implemented to have a structure in which the length of the first plate 100 extends or to include a movable driver, for the above-described driving.

When the head 110 and the first nozzle 121, the second nozzle 123, the third nozzle 125, and the barrier wall 111 formed in the head 110 are referred to as one group, the plurality of first plates may refer to a plurality of groups.

The mask 20 may be placed on the second plate 200 and a position of a main body in the second plate 200 may be adjusted according to the removal process for the glue 30.

As illustrated in FIG. 1, the second plate 200 may include a chuck 210 and a deviation preventing guide 220.

The chuck 210 may be configured to place the mask 20 on the second plate 200 and a position of the chuck may be moved via the driver 300 to be described later.

The deviation preventing guide 220 may be configured to fix the mask 20 placed on the second plate 200.

Figure 5A:
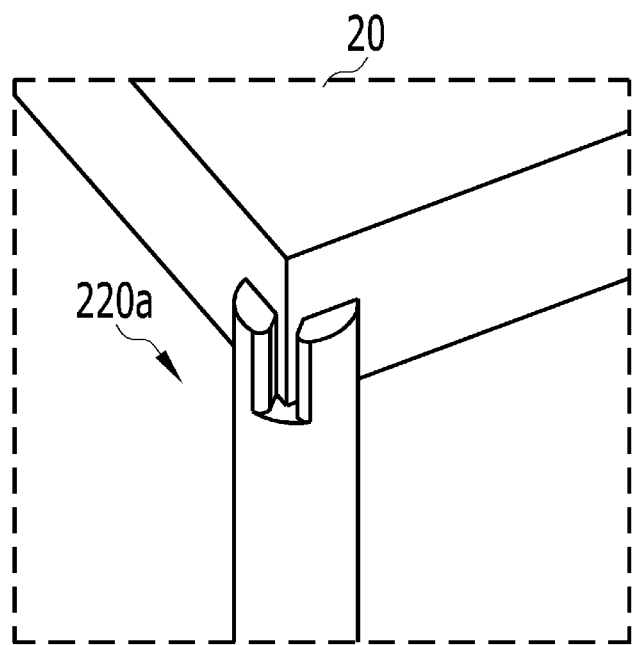
FIGS. 5A and 5B are diagrams illustrating examples of a deviation preventing guide according to an embodiment of the present disclosure.
Figure 5B:
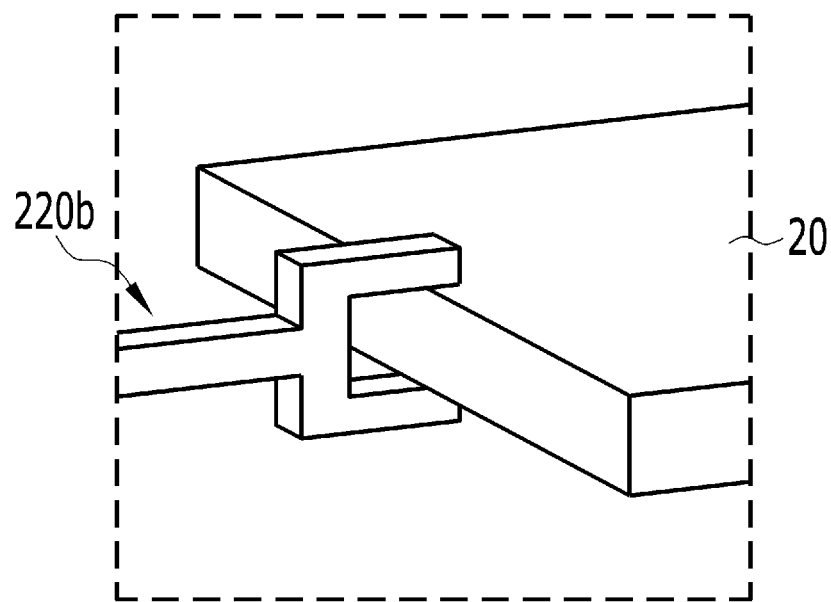

FIGS. 5A and 5B are diagrams illustrating examples of a deviation preventing guide according to an embodiment of the present disclosure.

As illustrated in FIG. 5A, the apparatus may include four deviation preventing guides 220 of a post pin type 220a each of which fixes one of the four edges of the mask 20. The pin type deviation preventing guide 220a may each include a cut area (221a of FIG. 8) for receiving a corner of the mask 20. As illustrated in FIG. 5B, the deviation preventing guide 220 may be a clamp type deviation preventing guide 220b which fixes the mask 20 up and down. A region of the clamp type deviation preventing guide 220b which contacts the mask 20 may be made of a material for preventing damage to the mask 20 such as a scratch, for example, a Teflon material, but this is not limited thereto. The clamp type deviation preventing guide 220b may be installed to only contact the periphery of the mask 20 and not the glue region 23 of the mask 20 so that the clamp type deviation preventing guide 220b may not interfere with the removal work of the glue 30. The clamp type deviation preventing guide may include, for example, an elongated member and a bracket like "[" member attached to the elongated member as shown in FIG. 5B.

The clamp type deviation preventing guide 220b may be installed in the inner wall of the chamber 1 separately from the second plate 200.

As illustrated in FIG. 8 to be described later, the clamp type deviation preventing guide 220b may improve the fixing force of the mask 20 when the mask 20 is tilted to have an arbitrary inclination.

Although not shown in the drawings, the deviation preventing guide 220 may be formed to include the post pin type deviation preventing guide 220a and the clamp type deviation preventing guide 220b separately formed from the post pin type deviation preventing guide 220a. The post pin type deviation preventing guide 220a may be installed over the second plate 200 and the clamp type deviation preventing guide 220b may be installed in the inner wall of the chamber 1.

The driver 300 may be configured to control operations of the first plate 100 and the second plate 200 and include a first driver 310, a second driver 320, and a third driver 330. The first driver 310, the second driver 320, and the third driver 330 may be implemented with motors, but this is not limited thereto.

Specifically, the first driver 310 may be configured to adjust a position of the head 110 of the first plate 100.

The second driver 320 may be configured to adjust the dispensing angles of the plurality of nozzles 121, 123, and 125.

The third driver 330 may be configured to adjust the position of the main body of the second plate 200 upwards or downwards or to adjust a slope of the main body of the second plate 200.

Figure 6:
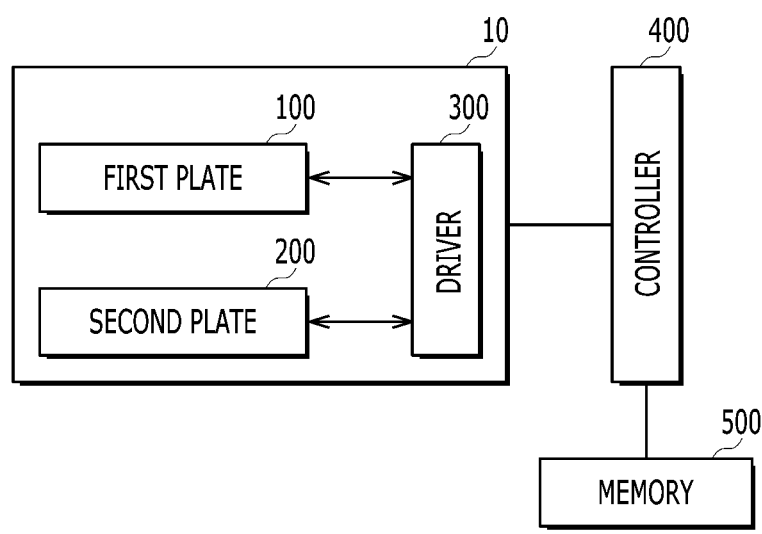
FIG. 6 is a block diagram illustrating a configuration of a mask glue removing system according to an embodiment of the present disclosure.

FIG. 6 is a block diagram illustrating a configuration of a mask glue removing system 40 according to an embodiment of the present disclosure.

Referring to FIG. 6, the mask glue removing system 40 may include the mask glue removing apparatus 10, a controller 400, and a memory 500.

As illustrated in FIG. 6, the mask glue removing apparatus 10 may include the first plate 100, the second plate 200, and the driver 300.

The first plate 100 may include the plurality of nozzles 121, 123, and 125 to be adjusted at independent dispensing angles of each other and the head 110 in which the plurality of nozzles 121, 123, and 125 are installed. The first plate 100 may move the head 110 close to a position corresponding to a region of the mask 20 in which the glue 30 is present, for example, the glue region 23 of the mask 20, adjust the dispensing angles of the plurality of nozzles 121, 123, and 125 so that the plurality of nozzles face the region in which the glue 30 is present, and dispense the chemical liquid, the rinse, and the air through the plurality of nozzles 121, 123, and 125 to remove the glue 30 from the mask 20.

Referring to FIG. 3, the mask 20 may include the pattern region 21 and the glue region 23 in which the glue 30 is formed.

Specifically, the position of the head 110 may be adjusted to a horizontal direction with respect to the top surface of the mask 20 so that the plurality of nozzles 121, 123, 125 installed in the head 110 may move close to the glue region 23 to easily remove the glue 30.

The position of the head 110 may be manually or automatically adjusted based on a dimension type of the pellicle attached to the mask 20 or the region in which the glue is located in the mask 20, for example, the glue region 23, which is captured through an image capturer (not shown). The method of adjusting the position of the head 110 is not limited to the method of adjusting the position of the head 110 in the horizontal direction with respect to the top surface of the mask 20. The position of the head 110 may also be adjusted in the vertical direction with respect to the top surface of the mask 20 according to the need of the operator.

Referring to FIG. 1, the first plate 100 may further include the barrier wall 111 configured to block the chemical liquid, the rinse, and the air dispensed from the first nozzle 121, the second nozzle 123, and the third nozzle 125 from flowing into the pattern region 21 of the mask 20.

As illustrated in FIG. 3, when the mask 20 is divided into the pattern region 21 and the glue region 23, the barrier wall 111 may prevent the chemical liquid, the rinse, and the air from flowing into the pattern region 21.

The mask 20 may be placed on the second plate 200 and a position of a main body in the second plate 200 may be adjusted according to the removal process for the glue 30.

Referring to FIG. 1, the second plate 200 may include the chuck 210 and the deviation preventing guide 220.

The chuck 210 may be configured to place the mask 20 on the second plate 200 and a position of the chuck 210 may be moved through the driver 300 to be described later.

The deviation preventing guide 220 may be configured to fix the mask 20 placed on the second plate 200.

FIGS. 5A and 5B are diagrams illustrating examples of a deviation preventing guide according to an embodiment of the present disclosure.

As illustrated in FIG. 5A, the deviation preventing guide 220 may have a post pin type deviation preventing guide 220a which fixes each of edges of the mask 20.

As illustrated in FIG. 5B, the deviation preventing guide 220 may have a clamp type deviation preventing guide 220b which fixes the mask 20 up and down.

Although not shown in drawings, the deviation preventing guide 220 may be formed to include the post pin type deviation preventing guide 220a and the clamp type deviation preventing guide 220b separately formed from the post pin type deviation preventing guide 220a. The post pin type deviation preventing guide 220a may be installed over the second plate 220 and the clamp type deviation preventing guide 220b may be installed in the inner wall of the chamber 1.

The driver 300 may be configured to change a position and a state of the first plate 100 or a position and a state of the second plate 200. The state may be a slope of the first plate 100 or the second plate 200. For example, changing the state may mean changing the slopes of the first plate 100 and the second plate 200.

The controller 400 may control the operations of the first and the second plates 100 and 200 through the driver 300 according to the removal process for the glue 30.

The controller 400 may perform at least one of adjustment to the position of the main body of the second plate 200 in a horizontal direction, adjustment of the position of the main body of the second plate 200 in a vertical direction, and adjustment of a slope of the main body of the second plate 200.

Figure 7A:
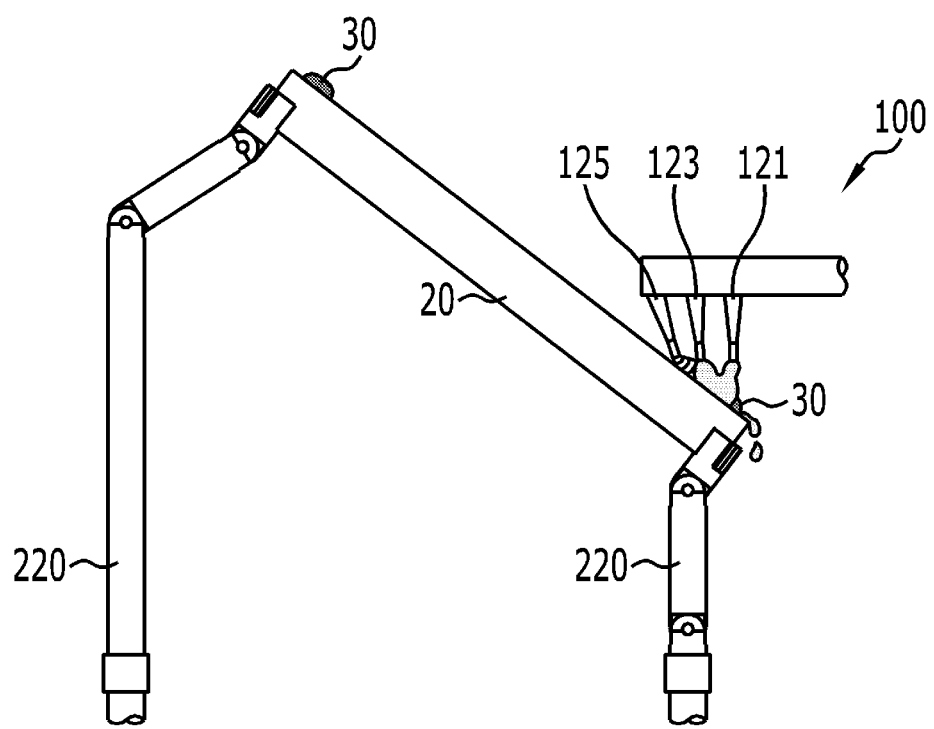
FIGS. 7A and 7B are diagrams for describing an example of adjusting a positon of a second plate according to an embodiment of the present disclosure.
Figure 7B:
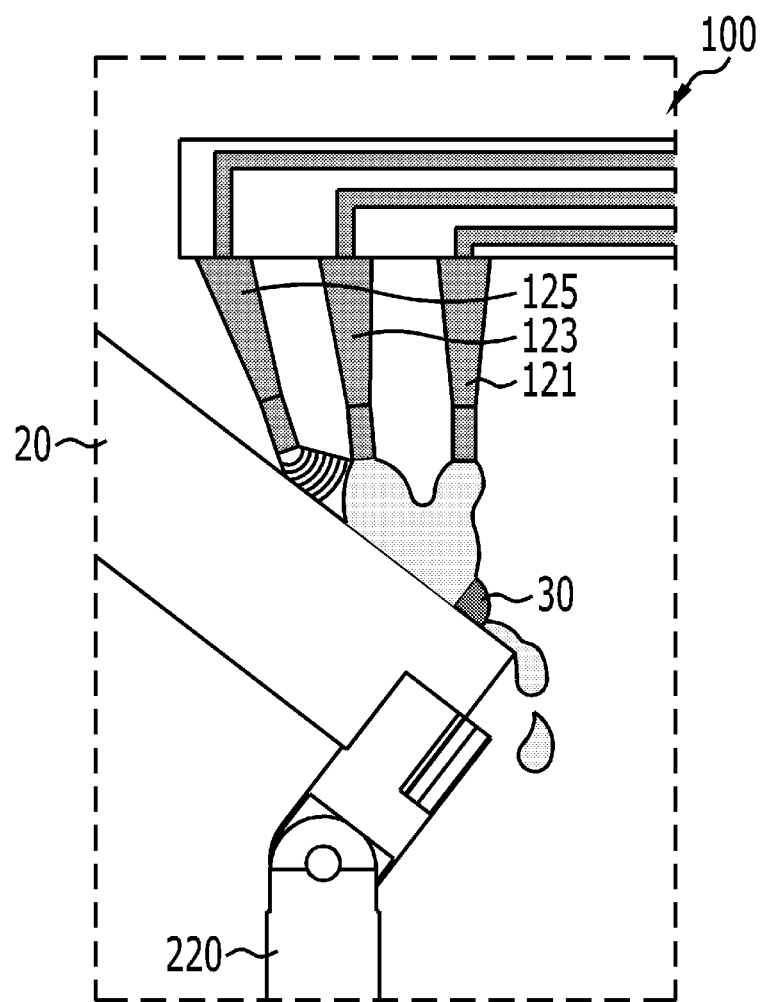

FIGS. 7A and 7B are diagrams for describing an example of adjusting a position of the second plate 200 according to an embodiment of the present disclosure.

As illustrated in FIGS. 7A and 7B, when the deviation preventing guide 200 is the post pin type deviation preventing guide 220a, the controller 400 may control the mask 20 to be inclined at a certain slope by extending the length of one or more deviation preventing guides among the deviation preventing guides 200 which fix the edges of the mask 20. Further, the controller 400 may also control the mask 20 to be inclined at a certain slope by shortening the length of one or more deviation preventing guides among the deviation preventing guides 220. Accordingly, each of the deviation preventing guides 220 configured to fix the mask 20 may have a structure in which the length thereof may be extended or reduced in the vertical direction.

The controller 400 may control the length of the deviation preventing guide 220 to extend in the vertical direction so that the mask 20 may be inclined toward a side so that the removal process for the glue 30 proceeds.

FIG. 8 is a diagram for describing an example of adjusting a position of a mask according to an embodiment of the present disclosure.

Referring to FIG. 8, when the deviation preventing guide 220 includes both the post pin type deviation preventing guide 220a and the clamp type deviation preventing guide 220b, the controller 400 may fix the mask 20 placed on the second plate 200 through the clamp type deviation preventing guide 220b, control the second plate 200 to move downwards, and adjust the slope of the mask 20 through the clamp type deviation preventing guide 220b.

The first plate 100 may be formed so that a width of the head 110 in a first direction (see "a" of FIG. 8) corresponds to an entire length of one side of the top surface of the mask 20. Through the structure of the first plate 100, all of the chemical liquid, the rinse, and the air dispensed from the plurality of nozzles 121, 123, and 125 may be applied on the one side of the top surface of the mask 20 even without the movement of the head 110 when removing the glue 30 formed on the one side of the top surface of the mask 20.

The controller 400 may adjust the mask 20 to be inclined toward a side that that the removal process for the glue 30 proceeds. In this case, the chemical liquid, the rinse, and the air may be completely blocked from flowing into the pattern region 21 of the mask 20.

The controller 400 may adjust the main body of the second plate 200 in the horizontal direction. For example, the controller 400 may control the main body of the second plate 200 to rotate at a first speed when the chemical liquid is dispensed and control the main body of the second plate 200 to rotate at a second speed faster than the first speed when the rinse is dispensed. The main body of the second plate 200 may rotate at a counterclockwise direction and a clockwise direction.

In addition, the controller 400 may control the main body of the second plate 200 to rotate or to be inclined at an arbitrary slope simultaneously when the chemical liquid, the rinse, or the air is dispensed from the plurality of nozzles 121, 123, and 125.

Figure 10:
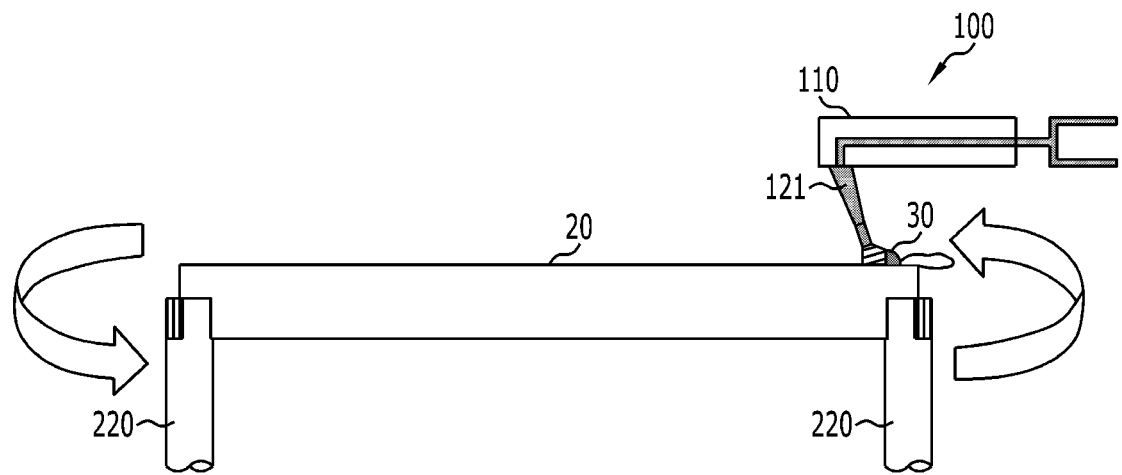

FIGS. 9 and 10 are diagrams for describing another example of adjusting a position of the second plate 200 according to an embodiment of the present disclosure.

Referring to FIG. 9, as the second plate 200 rotates on the basis of the horizontal direction, the mask 20 placed on the second plate 200 may also rotate. In this case, as illustrated in FIG. 10, the chemical liquid dispensed through the first nozzle 121 may not flow into the pattern region 21 of the mask 20 due to the centrifugal force generated in the mask 20 and may easily remove the glue 30.

Furthermore, the first plate 100 may be formed so that the width of the head 110 in the first direction (see "a" of FIG. 9) corresponds to a length of a portion of one side of the top surface of the mask 20.

The plurality of nozzles 121, 123, and 125 may be adjusted at independent dispensing angles of each other.

Specifically, the plurality of nozzles 121, 123, and 125 may include the first nozzle 121 configured to dispense the chemical liquid for removing the glue, the second nozzle 123 configured to dispense the rinse, and the third nozzle 125 configured to dispense the air, however, other nozzle dispensing configurations may be employed.

As the chemical liquid, a sulfuric acid peroxide mixture (SPM) in which $H_2SO_4$ and $H_2O_2$ are mixed or $H_2SO_4$ may be employed. However, the chemical liquid is not limited thereto and another material which can remove the glue 30 may be employed as the chemical liquid. As the rinse, deionized (DI) water such as a mixture of $H_2O$ and $CO_2$ may be employed, but this is not limited thereto. The air may be $N_2$ gas, but this is not limited thereto.

The controller 400 may control the first plate 100 to simultaneously dispense the chemical liquid through the first nozzle 121 and the air through the third nozzle 125 and to simultaneously dispense the rinse through the second nozzle 123 and the air through the third nozzle 125.

The plurality of nozzles 121, 123, and 125 may dispense the liquid chemical, the rinse, and the air in a non-contact manner in a state that the plurality of nozzles 121, 123, and 125 are spaced from the mask 20.

The first nozzle 121, the second nozzle 123, and the third nozzle 125 may be arranged in order of the first nozzle 121, the second nozzle 123, and the third nozzle 125 on the basis of the region in which the glue 30 is present.

The controller 400 may control the dispensing angles of the plurality of nozzles 121, 123, and 125 to be adjusted according to the pellicle dimension type of the mask 20 or the pattern size of the mask 20 or to be adjusted according to a position of the glue 30 in the mask 20 determined through an image capturer (not shown).

The memory 500 may store information related to the mask glue removing system 40 including a pellicle dimension type for each mask, a pattern size for each mask, and the like.

The pellicle dimension type may refer to a dimension of the pellicle attached to the mask 20 and include various dimensions. The position in which the glue is formed may be estimated according to the pellicle dimension, and thus the pellicle dimension type may be considered when the position of the head 110 is moved. Specifically, the pellicle dimension may include an inner dimension and an outer dimension and the glue may be estimated to be located in a region of the mask 20 between the inner dimension and the outer dimension.

Accordingly, the memory 500 may store the inner dimension and the outer dimension of the pellicle. If necessary, the memory 500 may further store the region of the mask between the inner dimension and the outer dimension of the pellicle as a glue position with the inner dimension and the outer dimension of the pellicle. The memory 500 may individually store the region between the inner dimension and the outer dimension of the pellicle as the glue position separately from the inner dimension and the outer dimension of the pellicle.

Figure 11:
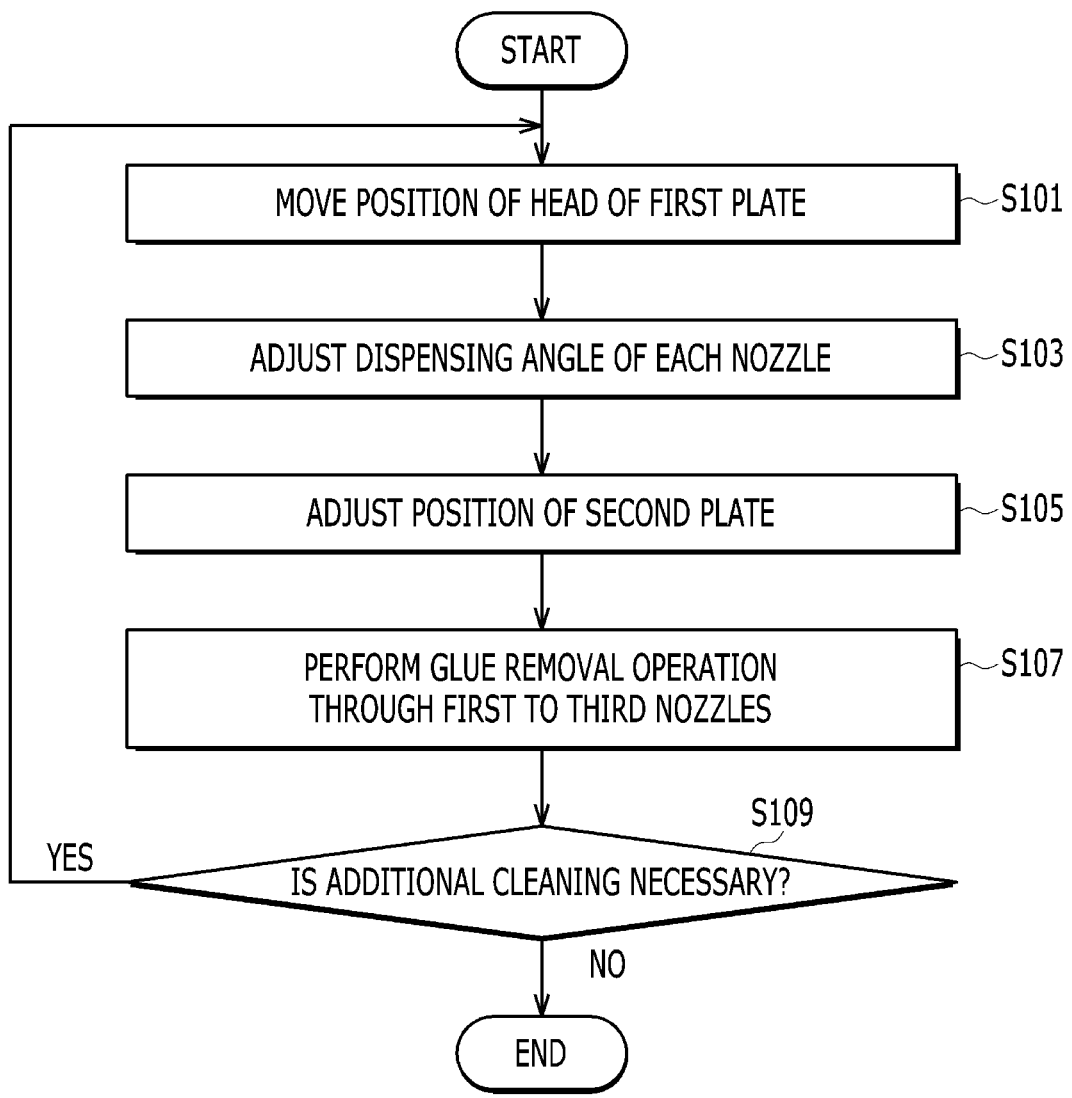
FIG. 11 is a flowchart for describing a mask glue removing method according to an embodiment of the present disclosure.

FIG. 11 is a flowchart for describing a mask glue removing method according to an embodiment of the present disclosure.

First, the glue mask removing system 40 may move the position of the head 110 of the first plate close to a position corresponding to a region of the mask 20 in which glue is present (S101).

As shown in FIG. 3, the mask 20 may include the pattern region 21 and the glue region 23 in which the glue 30 is formed. The glue mask removing system 40 may move the head 110 close to the glue region 23 to improve the removal performance for the glue 30.

Next, the glue mask removing system 40 may adjust the dispensing angles of the plurality of nozzles 121, 123, and 125 mounted on the first plate 100 so that the plurality of nozzles 121, 123, 125 face the region of the mask 20 in which the glue is present (S103).

The plurality of nozzles 121, 123, and 125 may be adjusted at dispensing angles independent of each other.

Specifically, the plurality of nozzles 121, 123, and 125 may include the first nozzle 121 configured to dispense the chemical liquid for removing the glue, the second nozzle 123 configured to dispense the rinse, and the third nozzle 125 configured to dispense the air, however, other dispensing configurations may be employed.

As the chemical liquid, a sulfuric acid peroxide mixture (SPM) in which $H_2SO_4$ and $H_2O_2$ are mixed or $H_2SO_4$ may be employed. However, the chemical liquid is not limited thereto and another material which can remove the glue 30 may be employed as the chemical liquid. As the rinse, deionized (DI) water such as a mixture of $H_2O$ and $CO_2$ may be employed, but this is not limited thereto. The air may be $N_2$ gas, but this is not limited thereto.

Next, the glue mask removing system 40 may adjust a position of the second plate 200 according to the removal process for the glue 30 in a state that the mask 20 is placed on the second plate 200 (S105).

More specifically, the glue mask removing system 40 may perform at least one of an adjustment of the position of the main body of the second plate 200 in a horizontal direction, an adjustment of the position of the main body of the second plate 200 in a vertical direction, and an adjustment of a slope of the main body of the second plate 200, according to the removal process for the glue 30.

Referring to FIGS. 7 and 8, when the deviation preventing guide 220 is formed to include the post pin type deviation preventing guide 220a and the clamp type deviation preventing guide 220b, the glue mask removing system 40 may fix the mask 20 placed on the second plate 200 through the clamp type deviation preventing guide 220b, control the second plate 200 to move downwards, and adjust the slope of the mask 20 through the clamp type deviation preventing guide 220b.

At this time, the glue mask removing system 40 may adjust the mask 20 to be inclined at an arbitrary angle toward a side so that the removal process for the glue 30 proceeds. In this case, the chemical liquid, the rinse, and the air may be completely blocked from flowing into the pattern region 21 of the mask 20.

Next, the glue mask removing system 40 may perform a removal operation for the glue 30 by dispensing the liquid chemical, the rinse, and the air through the plurality of nozzles 121, 123, and 125 (S107).

Although not shown in the drawings, the glue mask removing system 40 may control the main body of the second plate 200 to rotate at a first speed when the chemical liquid is dispensed through the first nozzle 121 and control the main body of the second plate 200 to rotate at a second speed faster than the first speed when the rinse is dispensed through the second nozzle 123.

Referring to FIG. 9, as the second plate 200 rotates on the basis of the horizontal direction, the mask 20 placed on the second plate 200 may also rotate. In this case, as illustrated in FIG. 10, the chemical liquid dispensed through the first nozzle 121 may not flow into the pattern region 21 of the mask 20 due to the centrifugal force generated in the mask 20 and may easily remove the glue 30.

In addition, the glue mask removing system 40 may control the main body of the second plate 200 to rotate or to be inclined at an arbitrary angle simultaneously when the chemical liquid, the rinse, and the air are dispensed from the plurality of nozzles 121, 123, and 125.

Next, the glue mask removing system 40 may determine whether or not the glue 30 of the mask 20 remains or whether or not a portion of the top surface of the mask to which the removal process of the glue 30 is not applied is present (S109). When it is determined that additional cleaning is necessary, the glue mask removing system 40 may proceed to operation S101 again and when it is determined that the additional cleaning is not necessary, the glue mask removing system 40 may finish the cleaning process.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are possible in view of the present disclosure and are intended to fall within the scope of the appended claims.

While the present disclosure has been illustrated and described with respect to specific embodiments, it will be apparent to those skilled in the art in light of the present disclosure that various changes and modifications may be made without departing from the spirit and scope of the invention as defined in the following claims.

What is claimed is:

1. A mask glue removing apparatus comprising:
   a first plate including a plurality of nozzles configured to be adjusted at independent dispensing angles of each other and a head in which the plurality of nozzles are installed and configured to move the head close to a position corresponding to a region of a mask in which glue is present, adjust the dispensing angles so that the plurality of nozzles face the region in which the glue is present, and dispense a chemical liquid, rinse, and air through the plurality of nozzles to remove the glue; and
   a second plate on which the mask is placed and configured to adjust a position of a main body thereof according to a removal process for the glue, the second plate including at least one clamp type deviation preventing guide which fixes the mask up and down, to adjust a slope of the mask.

2. The mask glue removing apparatus of claim 1, wherein the plurality of nozzles includes:
   a first nozzle configured to dispense the chemical liquid for glue removal;
   a second nozzle configured to dispense the rinse; and
   a third nozzle configured to dispense the air.

3. The mask glue removing apparatus of claim 2, wherein the first plate further includes a barrier wall configured to block the chemical liquid, the rinse, and the air dispensed from the first nozzle, the second nozzle, and the third nozzle from flowing into a pattern region of the mask.

4. The mask glue removing apparatus of claim 2, wherein the first nozzle, the second nozzle, and the third nozzle are positioned in order of the first nozzle, the second nozzle, and the third nozzle on the basis of the region of the mask in which the glue is present.

5. The mask glue removing apparatus of claim 1, wherein the dispensing angles of the plurality of nozzles are adjusted according to a pellicle dimension type of the mask or a pattern size of the mask, or the dispensing angles of the plurality of nozzles are adjusted according to a glue position in the mask determined through an image capturer.

6. The mask glue removing apparatus of claim 1, wherein the second plate further includes a post pin type deviation preventing guide which fixes edges of the mask.

7. The mask glue removing apparatus of claim 1, wherein the first plate includes a plurality of first plates, and the plurality of first plates are formed in positions corresponding to one or more of a first side, a second side, a third side, and a fourth side of a top surface of the mask in which the glue is formed.

8. The mask glue removing apparatus of claim 1, further comprising:
   a first-plate driver configured to adjust a position of the head of the first plate;
   a nozzle driver configured to adjust the dispensing angles of the plurality of nozzles; and
   a second-plate driver configured to adjust a position of a main body of the second plate upwards or downwards, wherein the mask is placed on the main body of the second plate.

9. A mask glue removing system comprising:
   a first plate including a plurality of nozzles to be adjusted at independent dispensing angles of each other and a head in which the plurality of nozzles are installed and configured to move the head close to a position corresponding to a region of a mask in which glue is present, adjust the dispensing angles so that the plurality of nozzles face the region in which the glue is present, and dispense a chemical liquid, rinse, or air through the plurality of nozzles to remove the glue;
   a second plate on which the mask is placed on and configured to adjust a position of a main body according to a removal process for the glue, wherein the mask is placed on the main body of the second plate;
   a deviation preventing guide including a post pin type deviation preventing guide which fixes edges of the mask on the main body, and a clamp type deviation preventing guide fixing the mask;
   a driver configured to change a position and a state of the first plate, or a position and a state of the second plate; and
   a controller configured to control operations of the first and second plates through the driver according to the removal process of the glue,
   wherein the mask is supported on the main body of the second plate when the second plate is moved to a horizontal direction or a vertical direction.

10. The mask glue removing system of claim 9, wherein the controller further performs at least one among an operation of adjusting a position of a main body of the second plate in the horizontal direction, and an operation of adjusting the position of the main body of the second plate in the vertical direction.

11. The mask glue removing system of claim 10, wherein the controller controls the main body of the second plate in the horizontal direction so that the main body rotates at a first speed when the chemical liquid is dispensed, and the main body rotates at a second speed faster than the first speed when the rinse is dispensed.

12. The mask glue removing system of claim 9, wherein the first plate includes:
   a first nozzle configured to dispense the chemical liquid for glue removal;
   a second nozzle configured to dispense the rinse; and
   a third nozzle configured to dispense the air,
   wherein the first nozzle, the second nozzle, and the third nozzle are positioned in order of the first nozzle, the second nozzle, and the third nozzle on the basis of the region of the mask in which the glue is present.

13. The mask glue removing system of claim 12, wherein the controller controls the first plate to simultaneously perform dispensing of the chemical liquid through the first nozzle and dispensing of the air through the third nozzle and to simultaneously perform dispensing of the rinse through the second nozzle and dispensing of the air through the third nozzle.

14. The mask glue removing system of claim 12, wherein the first plate further includes a barrier wall configured to block the chemical liquid, the rinse, and the air dispensed from the first nozzle, the second nozzle, and the third nozzle from flowing into a pattern region of the mask.

15. The mask glue removing system of claim 9, wherein the dispensing angles of the plurality of nozzles are adjusted according to a pellicle dimension type of the mask or a pattern size of the mask, or the dispensing angles of the plurality of nozzles are adjusted according to a glue position in the mask determined through an image capturer.

16. A mask glue removing system comprising:
   a first plate including a plurality of nozzles to be adjusted at independent dispensing angles of each other and a head in which the plurality of nozzles are installed and configured to move the head close to a position corresponding to a region of a mask in which glue is present, adjust the dispensing angles so that the plurality of nozzles face the region in which the glue is present, and dispense a chemical liquid, rinse, or air through the plurality of nozzles to remove the glue;
   a second plate on which the mask is placed on and configured to adjust a position of a main body according to a removal process for the glue;
   a driver configured to change a position and a state of the first plate, or a position and a state of the second plate; and
   a controller configured to control operations of the first and second plates through the driver according to the removal process of the glue,
   wherein the second plate further includes a deviation preventing guide configured to fix the mask placed on the second plate,
   wherein the deviation preventing guide includes a post pin type deviation preventing guide which fixes edges of the mask, and a clamp type deviation preventing guide which fixes the mask up and down,
   wherein the post pin type deviation preventing guide is installed over the second plate and the clamp type deviation preventing guide is installed in an inner wall of a chamber, and
   wherein the controller fixes the mask placed on the second plate through the clamp type deviation preventing guide, controls the second plate to move downwards, and adjusts a slope of the mask through the clamp type deviation preventing guide.

* * * * *